United States Patent [19]

Kawamura

[11] Patent Number: 5,262,276
[45] Date of Patent: Nov. 16, 1993

[54] LIGHT-SENSITIVE COMPOSITIONS
[75] Inventor: Kouichi Kawamura, Shizuoka, Japan
[73] Assignee: Fuji Photo Film Co., Ltd., Minami-ashigara, Japan
[21] Appl. No.: 349,824
[22] Filed: May 10, 1989
[30] Foreign Application Priority Data May 11, 1988 [JP] Japan .................. 63-114440

[51] Int. Cl.$^5$ .................. G03F 7/031; G03F 7/033
[52] U.S. Cl. .................. 430/281; 522/34; 522/52; 522/63; 430/915; 430/920
[58] Field of Search .............. 522/52, 63, 904, 34; 430/281

[56] References Cited

U.S. PATENT DOCUMENTS

| | | | |
|---|---|---|---|
| 3,674,495 | 7/1972 | Esaka | 96/91 |
| 3,699,026 | 10/1972 | Jenkins | 522/52 |
| 3,962,055 | 6/1976 | Pacifici | 522/52 |
| 3,987,037 | 10/1976 | Bonham et al. | 522/63 |
| 4,189,323 | 2/1980 | Buhr | 522/63 |
| 4,772,534 | 9/1988 | Kawamura et al. | 522/52 |
| 4,774,163 | 9/1988 | Higashi | 522/63 |
| 4,791,213 | 12/1988 | Gawne et al. | 522/53 |
| 4,826,753 | 5/1989 | Higashi et al. | 522/63 |
| 4,837,128 | 6/1989 | Kawamura et al. | 522/52 |
| 4,895,880 | 1/1990 | Gottschalk | 522/63 |
| 5,187,045 | 2/1993 | Bonham et al. | 430/281 |

FOREIGN PATENT DOCUMENTS 0125140 11/1984 European Pat. Off. .

*Primary Examiner*—Marion E. McCamish
*Assistant Examiner*—Arthur H. Koeckert
*Attorney, Agent, or Firm*—Burns, Doane, Swecker & Mathis

[57] ABSTRACT

A light-sensitive composition which comprises at least one compound represented by the following general formula (I) as light-free radical generator:

$$S\text{-}L\text{-}A \qquad (I)$$

in formula (I), S represents a light absorbing moiety which absorbs light having a wave length of not less than 300 nm with an absorptivity coefficient of not less than 1000, A represents an active moiety which interacts with the light absorbing moiety S in an excited state to generate free radicals and L represents a group for coupling the moieties S and A; and a photopolymerizable composition which comprises at least one radical polymerizable compound having ethylenically unsaturated group, at least one compound represented by the foregoing general formula (I) as a light-free radical generator and optionally at least one linear organic high molecular weight polymer. The light-sensitive composition or the photo-polymerizable composition shows high sensitivity to actinic rays having a wave length ranging from near ultraviolet to visible region or further to near infrared region. Therefore, the composition can be imagewise exposed to light from a variety of light sources.

1 Claim, No Drawings

LIGHT-SENSITIVE COMPOSITIONS

BACKGROUND OF THE INVENTION

The present invention relates to light-sensitive compositions containing a novel compound which generates free radicals when it is irradiated with light (hereunder referred to as "light-free radical generator") and more particularly to light-sensitive compositions containing a novel light-free radical generator in which a moiety capable of absorbing light (hereunder referred to as "light absorbing moiety") and an active moiety capable of generating free radicals (hereunder referred to as "free radical generating moiety") through an interaction with the light absorbing moiety when the latter absorbs light and is excited are chemically bonded to one another.

There have been well known, in the field of graphic arts, compounds which are decomposed to generate free radicals when they are exposed to light. These compounds have widely been used as photopolymerization initiators in photopolymerizable compositions; photoactivators in free radical photographic compositions and photoinitiators for reactions which are catalized with an acid generated by the action of light. There have been produced various kinds of light-sensitive materials useful in image-forming systems such as printing, replicating and copying systems using such free radical generators.

To date, commonly used as such free radical generators in various industrial fields are, for instance, aryl alkyl ketones such as benzoin ethers, diethyl acetophenone, oxime esters, acylphosphine oxides, diaryl ketones such as benzophenone, benzil, quinones and bisimidazoles.

These free radical generators are detailed in Journal of Radiation Curing, 1987, July, pp. 6–16 and 18–31.

Typical examples of the free radical generators which generate halogen free radicals are carbon tetrabromide, iodoform and tribromoacetophenone and these generators have widely been used. In addition, s-triazine compounds substituted with trichloromethyl groups as disclosed in U.S. Pat. No. 4,619,998 and U.K. Patent No. 1,388,492 have also widely been used.

However, these free radical generators can be decomposed by irradiation with light having a wave length falling within a substantially limited range. More specifically, they are sensitive to light having wave length shorter than that of the principal rays of commonly used light sources, i.e., those falling within the ultraviolet range. In other words, these compounds cannot utilize effectively light having wave length ranging from near ultraviolet to visible region and thus their ability of generating free radicals is very low.

Recently, it has been tried to use visible lasers or near infrared lasers in addition to ultraviolet rays conventionally used. In such a case, free radical generators must be sensitive to these various laser rays.

Moreover, there have been investigated a method for substantially increasing sensitivity of light-sensitive materials and a method for forming images using a laser, and some methods such as UV projection exposure methods, methods of direct plate-making in which a laser is used, laser facsimile methods and holography have already been practically used. Thus, light-sensitive materials having high sensitivity have correspondingly been developed. To develop such highly sensitive light-sensitive materials, it is essential to find out or synthesize compounds which can effectively generate free radicals when irradiated with light having wave length ranging from near ultraviolet to visible region or further to near infrared region. Many attempts have been directed to the generation of free radicals with light having wave length ranging from near ultraviolet to visible region or further to near infrared region. All these attempts comprise adding, to light-sensitive materials, a combination of an activator capable of generating free radicals and a certain kind of light absorber.

For instance, in U.S. Pat. No. 3,652,275, chalcone type or dibenzylacetone type compounds are used as light absorber and bisimidazole compounds as activators capable of generating free radicals. Moreover, in U.K. Patent No. 2,020,297, merocyanine compounds are used as light absorbers and diphenyl-iodonium salts as activators. In Japanese Patent Un-examined Publication (hereunder referred to as "J. P. KOKAI") No. Sho 58-40302, thiopyrylium salts are used as light absorbers and trichloromethyl substituted-s-triazine compounds as activators; J. P. KOKAI No. Sho 57-21401 discloses a combination of dialkylamino-stilbene compounds as light absorbers and bisimidazole compounds as activators; and in J. P. KOKAI Nos. Sho 54-95687 and Sho 54-151024 and U.S. Pat. No. 4,481,276, merocyanine compounds are used as light absorbers and trichloromethyl substituted-s-triazine compounds as activators.

Moreover, ketocoumarin is used as a light absorber and N-phenyl glycine is used as an activator in "Polymer Engineering and Science", 1983, 23, p. 1022.

Other examples of such light absorbers and activators are disclosed in D. F. Eaton, "Advances in Photochemistry", 1987, 13, pp. 427–487. Specific examples of the light absorbers are acridinium dyes such as acriflavine; xanthene dyes such as Rose Bengale; and thiazine dyes such as Thionine and Methylene Blue, and specific examples of the activators are amines such as triethanolamine, hydrazine and triphenylamine; phosphorus compounds such as triphenyl phosphine and tri-n-butyl phosphine; sulfinic acids such as sodium p-toluene-sulfinate; sulfonic acid esters such as methyl p-toluene-sulfonate; heterocyclic compounds such as oxazole and imidazole; enolate compounds such as dimedone; tin compounds such as tributylbenzyl tin; arylthiourea and N-phenyl glycine.

Other examples of such light absorbers and activators are disclosed in U.S. Pat. Nos. 4,743,529 and 4,743,530.

Systems comprising these activators to which light absorbers are added make it possible to generate free radicals when they are irradiated with light having a wave length longer than that of light conventionally used and it has been tried to use light-sensitive compositions containing these compounds in a variety of fields. However, the free radical-generating ability of these compounds conventionally proposed is not yet sufficient and it has been required to develop light-sensitive compositions having more improved free radical-generating ability.

SUMMARY OF THE INVENTION

Accordingly, an object of the present invention is to provide a light-sensitive composition which contains free radical generators highly sensitive to light having a wave length of not less than 300 nm and which thus has high sensitivity to such light.

Another object of the present invention is to provide a photopolymerizable composition containing free radical generators highly sensitive to light having a wave length of not less than 300 nm.

The inventors of this invention have conducted various studies to achieve the foregoing objects, have found that a certain kinds of light-free radical generating compounds generate free radicals when they are irradiated with light having a wave length of not less than 300 nm in high efficiency and thus have completed the present invention.

Consequently, the present invention provides a light-sensitive composition comprising at least one compound represented by the following general formula (I):

$$S\text{-}L\text{-}A \quad (I)$$

In formula (I), S represents a light absorbing moiety which absorbs light having a wave length of not less than 300 nm with an absorptivity coefficient of not less than 1000, A represents an active moiety which interacts with the light absorbing moiety S in an excited state to generate free radicals and L represents a group for coupling the moieties S and A.

According to another aspect of the present invention, there is further provided a photopolymerizable composition which comprises at least one light-free radical generator represented by the general formula (I) explained above and at least one radical by polymerizable compound having at least one ethylenically unsaturated group.

DETAILED EXPLANATION OF THE INVENTION

The light-sensitive composition of the present invention will hereunder be explained in more detail.

In formula (I), preferred examples of such coupling groups represented by L are an ester bond, an amide bond, a sulfonamido bond, an ether bond, a thioether bond, an amino bond or any combination thereof.

As such compounds having the light absorbing moiety S which absorbs light having a wave length of not less than 300 nm with an absorptivity coefficient of not less than 1000, there may be listed light absorbers conventionally used in combination with activators. Specific examples thereof include the aforementioned chalcon and dibenzylacetone compounds; merocyanine dyes; thiopyrylium or pyrylium dyes; dialkylaminostilbenes; acridinium dyes; xanthene dyes; thiazene dyes; cyanine dyes; squarilium dyes and thioxanthone. Another examples include polynuclear aromatic and polynuclear heteroaromatic compounds such as anthracene, phenanthrene, pyrene, acridine, carbazole, phenothiazine and their derivatives.

Examples of the compounds having an active moiety which interacts with the excited moiety S to form free radicals include the aforementioned bisimidazole compounds; onium compounds such as diphenyliodonium and triphenylsulfonium salts; trichloromethyl substituted-s-triazine compounds; N-phenyl glycine; amines such as triethanolamine and hydrazine; phosphorus compounds such as triphenyl phosphine and tri-n-butyl phosphine; sulfinic acids such as sodium p-toluenesulfinate; sulfonic acid esters such as methyl p-toluenesulfonate; heterocyclic compounds such as oxazole and imidazole; enolate compounds such as dimedone; tin compounds such as tributylbenzyl tin; allylthiourea; oxime esters and borane compounds such as triphenyl-n-butyl borate. Residues of these compounds can be used as the active moieties of the novel free radical generators used in the present invention.

Preferred examples of the group L for coupling the moieties S and A are ester bonds represented by the following formulas (a) and (b):

-CO-O-     (a);

—O—CO—O—     (b)

amido bonds represented by the following general formulas (c) to (f):

-CO-NR-     (c);

—NR—CO—NR—     (d);

—CO—NR—SO$_2$—     (e);

—C—CONR—(f)

(wherein R represents a hydrogen atom, an alkyl group or an aryl group), sulfonamido bonds represented by the following general formula (g):

—SO$_2$—NR—     (g)

(wherein R is the same as that defined above), ether bonds, thioether bonds and amino bonds. Another example of the compounds having an active moiety are pyridinium compounds which are disclosed in "Research Disclosure", vol. 200, December 1980, Item 20036.

Among the compounds represented by the general formula (I), particularly preferred are those in which the light absorbing moiety S is a residue of a merocyanine dye, the active moiety A is an s-triazine residue having a trichloromethyl group and the coupling group L is an ester bond, an amido bond or a sulfonamido bond.

The merocyanine dyes used in the preparation of the compounds represented by formula (I) are commonly known merocyanine dyes having functional groups required for coupling the active moiety A thereto. Such merocyanine dyes are disclosed in, for instance, F. M. Hamer et al., "THE CYANINE DYES AND RELATED COMPOUNDS", 1964, PP. 511-611. Typical examples of such merocyanine dyes can be represented by the following general formula (II), but the present invention is not restricted to these specific examples:

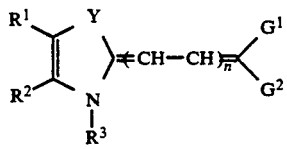

In formula (II), $R^1$ to $R^3$ each independently represents a hydrogen atom, a substituted or unsubstituted alkyl group, a substituted or unsubstituted aryl group or a substituted or unsubstituted allyl group; Y represents a divalent atom or group selected from the group consisting of —O—, —S—, —NR$^1$— (wherein $R^1$ is the same as that defined above), —Se—, —C(CH$_3$)$_2$— or —CH=CH—, provided that $R^1$ and $R^2$ may form a ring together with the carbon atoms to which they are bonded; n is an integer of 0, 1 or 2; and $G^1$ and $G^2$ may be the same or different and each represents a hydrogen atom, a cyano group, an unsubstituted or substituted alkoxycarbonyl group, an unsubstituted or substituted aryloxycarbonyl group, an unsubstituted or substituted acyl group, an unsubstituted or substituted arylcarbonyl group, an alkylthio group, an arylthio group, an alkylsulfonyl group, an arylsulfonyl group or a fluoroalkylsulfonyl group, provided that $G^1$ and $G^2$ cannot represent hydrogen atoms simultaneously and that $G^1$ and $G^2$ may form a ring comprising non-metallic atoms together with the carbon atoms to which they are bonded.

If $G^1$ and $G^2$ form a ring comprising non-metallic atoms together with the carbon atoms to which they are bonded, the rings are those usually used as acidic nuclei in the merocyanine dyes and examples thereof are as follows:

(a) 1,3-dicarbonyl nuclei such as 1,3-indandione, 1,3-cyclohexanedione, 5,5-dimethyl-1,3-cyclohexanedione and 1,3-dioxane-4,6-dione;

(b) pyrazolinone nuclei such as 3-methyl-1-phenyl-2-pyrazolin-5-one, 1-phenyl-2-pyrazolin-5-one and 1-(2-benzothiazolyl)-3-methyl-2-pyrazolin-5-one;

(c) isoxazolinone nuclei such as 3-phenyl-2-isoxazolin-5-one and 3-methyl-2-isoxazolin-5-one;

(d) oxyindole nuclei such as 1-alkyl-2,3-dihydro-2-oxyindole;

(e) 2,4,6-triketohexahydro-pyrimidine nuclei such as barbituric acid and derivatives thereof, for instance, 1-alkyl derivatives such as 1-methyl and 1-ethyl derivatives; 1,3-dialkyl derivatives such as 1,3-diethyl and 1,3-dibutyl derivatives; 1,3-diaryl derivatives such as 1,3-diphenyl, 1,3-di-(p-chlorophenyl) and 1,3-di-(p-ethoxycarbonylphenyl) derivatives; and 1-alkyl-3-aryl derivatives such as 1-ethyl-3-phenyl derivatives;

(f) 2-thio-2,4-thiazolidine-dione nuclei such as rhodanine and derivatives thereof, for instance, 3-alkylrhodanine such as 3-ethylrhodanine and 3-allylrhodanine, 3-arylrhodanine such as 3-phenylrhodanine;

(g) 2-thio-2,4-oxazolidinedione-(2-thio-2,4-(3H, 5H)-oxazoledione) nuclei such as 2-ethyl-2-thio-2,4-oxazolidine-dione;

(h) thianaphthenone nuclei such as 3(2H)-thianaphthenone and 3(2H)-thianaphthenone-1,1-dioxide;

(i) 2-thio-2,5-thiazolidinedione nuclei such as 3-ethyl-2-thio-2,5-thiazolidinedione;

(j) 2,4-thiazolidinedione nuclei such as 2,4-thiazolidinedione, 3-ethyl-2,4-thiazolidine-dione and 3-phenyl-2,4-thiazolidinedione;

(k) thiazolidinone nuclei such as 4-thiazolidinone and 3-ethyl-4-thiazolidinone;

(l) 4-thiazolinone nuclei such as 2-ethylmercapto-5-thiazolin-4-one and 2-alkylphenylamino-5-thiazolin-4-one;

(m) 2-imino-2-oxozolin-4-one (pseudohydantoin) nuclei;

(n) 2,4-imidazolidinedione (hydantoin) nuclei such as 2,4-imidazolidinedione and 3-ethyl-2,4-imidazolidinedione;

(o) 2-thio-2,4-imidazolidinedione (2-thiohydantoin) nuclei such as 2-thio-2,4-imidazolidinedione and 3-ethyl-2-thio-2,4-imidazolidinedione;

(p) 2-imidazolin-5-one nuclei such as 2-n-propyl-mercapto-2-imidazolin-5-one; and (q) furan-5-one nuclei.

In this respect, the merocyanine dyes must have, on any one of $R^1$ to $R^3$ and $G^1$ and $G^2$, at least one functional group which reacts with a compound having an active moiety to thus form a coupling group L, for instance, a carboxyl group, a hydroxyl group, an amino group, a sulfonyl group, an isocyanate group and a thiol group.

The s-triazine compounds having trichloromethyl group, which may be the active moieties of compounds (I) are represented by the following general formula (III):

In formula (III), $R^4$ and $R^5$ each represents a hydrogen atom, a substituted or unsubstituted alkyl group, a substituted or unsubstituted aryl group or a substituted alkenyl group, provided that one of $R^4$ and $R^5$ must have at least one functional group which reacts with a compound having a light absorbing moiety S to thus form a coupling group L.

Examples of the substituted alkyl groups represented by $R^4$ and $R^5$ include trichloromethyl and trifluoromethyl groups; examples of the substituted aryl group include 4-styrylphenyl and 4-(substituted)-styrylphenyl groups; examples of the substituted alkenyl groups are styryl and substituted styryl groups; and examples of aryl groups are residues of polynuclear aromatic compounds such as naphthyl group and residues of heteroaromatic compounds such as thiofuran. In addition, examples of functional groups required for forming a coupling with the light absorbing moiety S include those listed above in connection with the compounds (II).

Typical examples of novel light-free radical generator compounds which may be used in the present invention are as follows (in the following examples, "Ph" means a phenyl group), but the present invention is not restricted to these specific examples:

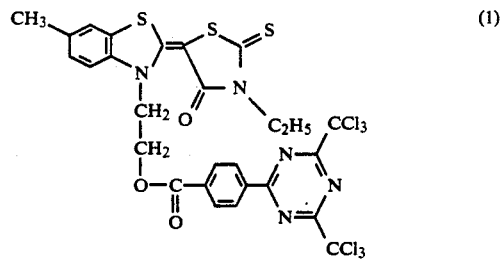

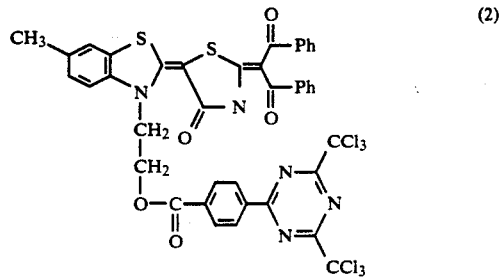

-continued
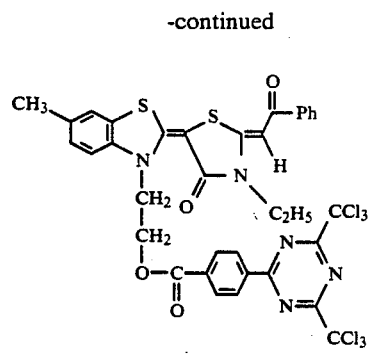
(3)
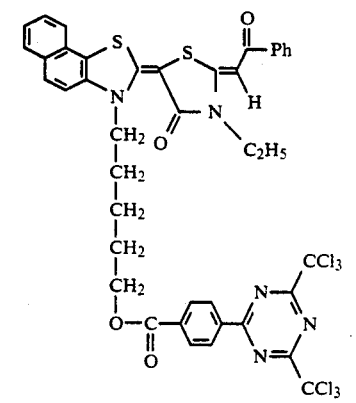
(4)
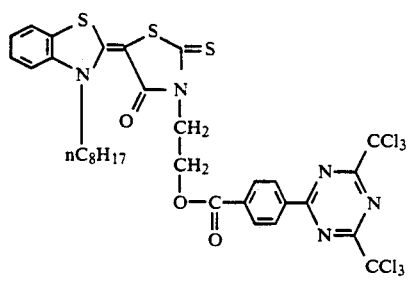
(5)
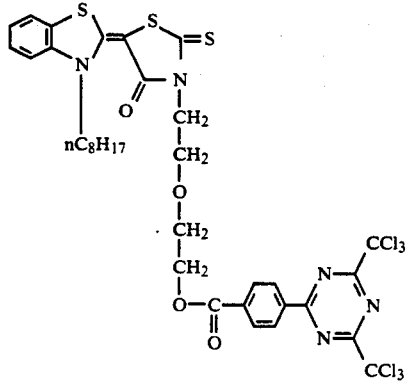
(6)
-continued
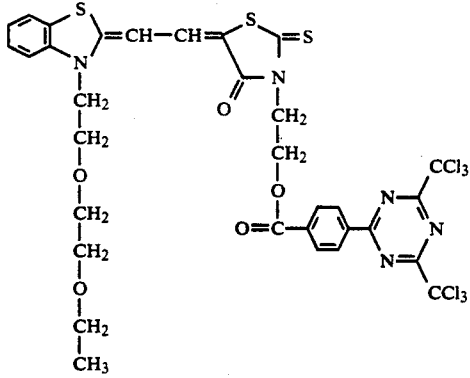
(7)
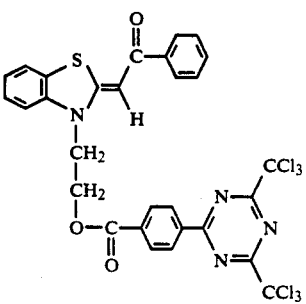
(8)
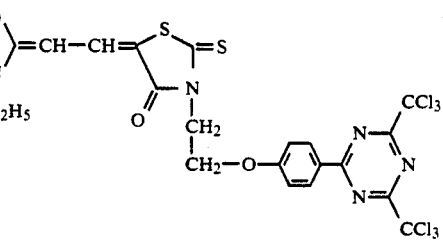
(9)
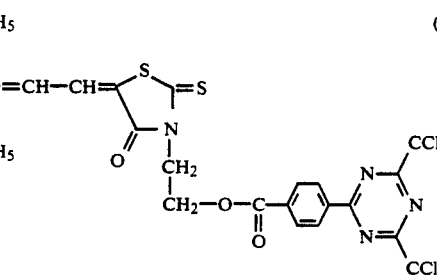
(10)
(11)
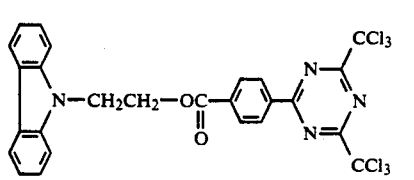
(12)

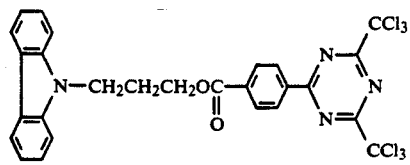

(13)

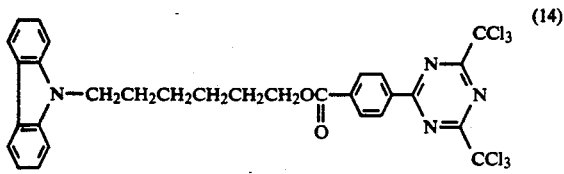

(14)

The free radical generators represented by formula (I) are particularly useful if they are used in the photopolymerizable compositions as photopolymerization initiators.

When the free radical generator of formula (I) is used in a photopolymerizable composition, the photopolymerizable composition comprises at least one polymerizable compound having an ethylenically unsaturated bond, at least one photopolymerization initiator and optionally at least one linear organic high molecular weight polymer and is useful, in particular, for forming light-sensitive layers of presensitized plates for use in making lithographic printing plates (hereunder referred to as "PS plates"), photoresists or the like.

The amount of the free radical generator added to the photopolymerizable composition of this invention ranges from 0.01 to 60% by weight on the basis of the total weight of the photopolymerizable ethylenically unsaturated compound and the linear organic high molecular weight polymer optionally added to the composition. More preferred results can be obtained if it ranges from 1 to 30% by weight.

The polymerizable compounds having an ethylenically unsaturated bond used in the invention are compounds which have at least one ethylenically unsaturated bond in the molecule. For instance, the compounds are those having a chemical form such as monomer, prepolymer (i.e., dimers, trimers and oligomers) or mixtures thereof as well as copolymers thereof. Examples of such monomers and copolymers thereof are esters of unsaturated carboxylic acids and aliphatic polyhydric alcohols; and amides of unsaturated carboxylic acids and aliphatic polyvalent amines.

Typical examples of such ester monomers of unsaturated carboxylic acids and aliphatic polyhydric alcohols include such acrylates as ethylene glycol diacrylate, triethylene glycol diacrylate, 1,3-butanediol diacrylate, tetramethylene glycol diacrylate, propylene glycol diacrylate, neopentyl glycol diacrylate, trimethylol-propane triacrylate, trimethylol-propane tri(acryloyloxypropyl) ether, trimethylol-ethane triacrylate, hexanediol diacrylate, 1,4-cyclohexane-diol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer.

Typical examples of such ester monomers of unsaturated carboxylic acids and aliphatic polyhydric alcohols further include such methacrylates as tetramethylene glycol dimethacrylate, triethylene glycol dimethacrylate, neopentyl glycol dimethacrylate, trimethylol-propane trimethacrylate, trimethylol-ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)-phenyl) dimethyl-methane and bis(p-(acryloxy-ethoxy)-phenyl) dimethylmethane.

In addition, examples of the amide monomers of aliphatic polyvalent amines and unsaturated carboxylic acids include methylene-bisacrylamide, methylene-bismethacrylamide, 1,6-hexamethylene-bisacrylamide, 1,6-hexamethylene-bismethacrylamide, diethylene-triamine trisacrylamide, xylylene bisacrylamide and xylylene bismethacrylamide.

These esters and amides are used in an amount of not less than 5% by weight, preferably 10 to 99.5% by weight on the basis of the total weight of the composition.

The linear organic high molecular weight polymers usable in the invention are not restricted to specific ones so far as they are linear organic high molecular weight polymers compatible with the foregoing photopolymerizable ethylenically unsaturated compounds. However, it is desirable to select water— or weak alkali-soluble or —swellable linear organic high molecular weight polymers to make the resulting composition developable with water or weak alkaline aqueous solution. For instance, if water-soluble organic high molecular weight polymers are employed, the resulting composition can be developed with water. Examples of such linear organic high molecular weight polymers include addition polymers having carboxyl groups on the side chains thereof such as methacrylic acid copolymers, acrylic acid copolymers, itaconic acid copolymers, crotonic acid copolymers, maleic acid copolymers and partially esterified maleic acid copolymers as disclosed in J. P. KOKAI Nos. Sho 59-44615, Sho 54-92723, Sho 59-53836 and Sho 59-71048 and Japanese Patent Publication for Opposition Purpose (hereunder referred to as "J. P. KOKOKU") Nos. Sho 54-34327, Sho 58-12577 and Sho 54-25957. Likewise, examples thereof further include acidic cellulose derivatives having carboxyl groups on the side chains. Besides, those obtained by adding cyclic acid anhydrides to addition polymers having hydroxyl groups are also useful. Particularly preferred are copolymers of benzyl (meth)acrylate/(meth) acrylic acid/other optional addition polymerizable vinyl monomers and copolymers of allyl (meth)acrylate/(meth)acrylic acid/other optional additional polymerizable vinyl monomers.

These linear organic high molecular weight polymers are used alone or in combination in the photopolymerizable composition of the invention and these polymers may be incorporated into the light-sensitive composition in any amount. However, if it exceeds 90% by weight on the basis of the total weight of the composition, the strength of images formed is possibly impaired.

Moreover, a higher aliphatic acid derivative such as behenic acid or behenic acid amide or the like may optionally be added to the photopolymerizable composition to let it come up to the surface of the light-sensitive layer to thus prevent the polymerization inhibitory effect of oxygen. The amount of the higher aliphatic acid derivative preferably ranges from about 0.5 to about 10% by weight on the basis of the total weight of the composition. Furthermore, dyes or pigments may be added to the photopolymerizable composition to dye the light-sensitive layer. The amount thereof preferably ranges from about 0.5 to about 5% by weight based on the total weight of the composition. In addition, the photopolymerizable composition may further comprise inorganic fillers for the purpose of improving physical properties of hardened films and/or other known additives.

When the photopolymerizable composition is applied to a proper substrate to use the same as light-sensitive layers of, for instance, PS plates, a plate-like material having dimensional stability is employed as such a substrate. Examples of such dimensionally stable plate-like materials include paper, paper laminated with a plastic film such as a polyethylene, polypropylene or polystyrene film, metal plates such as aluminum (inclusive of aluminum alloys), zinc and copper plates, plastic films such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal films, paper or plastic films which are laminated with a foil of the foregoing metal, or to which a layer of the foregoing metal is deposited.

Among these substrates, aluminum plates are particularly preferred because of their high dimensional stability and low cost, in making PS plates. Moreover, preferred examples of substrates also include composite sheets, for instance, composed of a polyethylene terephthalate film and an aluminum sheet bonded thereto as disclosed in J. P. KOKOKU No. Sho 48-18327.

If the substrate have a metal surface, in particular, an aluminum surface, the substrate is preferably subjected to a surface treatment such as graining, dipping treatment in an aqueous solution of sodium silicate, potassium fluorozirconate or a phosphate or anodization treatment.

A protective layer may be formed on the layer of the photopolymerizable composition applied onto the surface of a substrate to eliminate polymerization inhibitory effect of oxygen in the air. Such a protective layer may be obtained from polymers excellent in oxygen barrier properties such as polyvinyl alcohol and acidic celluloses. Methods for applying such a protective layer are detailed in, for instance, U.S. Pat. No. 3,458,311 and J. P. KOKOKU No. Sho 55-69729.

The light-sensitive materials in which the photopolymerizable composition of the present invention is used are imagewise exposed to light and developed with a developer to remove un-exposed areas of the light-sensitive layer to thus form images. Examples of preferred developers used when these photopolymerizable composition are used to prepare PS plates and hence lithographic printing plates include those disclosed in J. P. KOKOKU No. Sho 57-7427, in other words an aqueous solution of an inorganic alkaline agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, sodium carbonate or aqueous ammonia or organic alkaline agent such as monoethanolamine or diethanolamine. The concentration of these alkaline agents in general ranges from 0.1 to 10% by weight, preferably 0.5 to 5% by weight.

The alkaline aqueous solution may optionally contain a small amount of a surfactant and an organic solvent such as benzyl alcohol, 2-phenoxyethanol or 2-butoxyethanol. Examples thereof include those disclosed in U.S. Pat. Nos. 3,375,171 and 3,615,480.

The light-sensitive composition or the photopolymerizable composition of the present invention which comprises novel light-free radical generator compounds shows high sensitivity to actinic rays having a wave length ranging from near ultraviolet to visible region or further to near infrared region. Therefore, the composition can be imagewise exposed to light from various light sources such as high pressure, medium pressure and low pressure mercury lamps, a chemical lamp, a carbon arc lamp, a xenon lamp, a metal halide lamp, various laser lamps, for instance, a visible laser, a ultraviolet laser and a near infrared laser, a fluorescent lighting and solar rays.

The light-sensitive or photopolymerizable composition the present invention will hereunder be described in more detail with reference to the following nonlimitative working Examples and Preparation Examples and the effects practically achieved by the present invention will also be discussed in detail in comparison with Comparative Examples.

PREPARATION EXAMPLE: PREPARATION OF COMPOUND (1)

Compound (1) can be prepared from a compound (1-S) having a light absorbing moiety and a compound (1-A) having an active moiety represented by the following formulas:

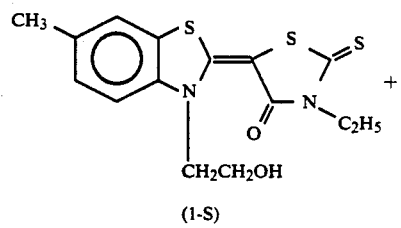

(1-S)

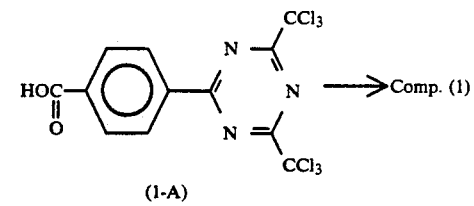

(1-A)

Methodology is as follows:

3.9 g of Compound (1-A) and 6 ml of thionyl chloride were admixed with one another and the mixture was heated under reflux for 30 minutes. Then after distilling off excess thionyl chloride in vacuo, 2.8 g of Compound (1-S) and 500 ml of anhydrous tetrahydrofuran were added followed by heating the mixture under reflux and then ice-cooling the resulting solution.

To this solution there was added 2.2 g of N,N-di methylaminopyridine and the solution was stirred at room temperature for one hour. The reaction solution was poured into 2 l of water to which 1 ml of conc. HCl was added and the resultant solid was filtered off. The solid was recrystallized from ethyl acetate to thus obtain 1.45 g of crystals.

M.P.=229°-230° C.

UV spectra (in acetonitrile): 429 nm ($\epsilon$: 6.29×10$^4$); 281 nm ($\epsilon$: 3.55×10$^4$);

Elemental Analysis: for $C_{27}H_{19}N_5S_3O_3Cl$: Calculated (%): C: 42.10; H: 2.49; N: 9.90; Cl: 27.61; Found (%): C: 41.98; H: 2.40; N: 9.13; Cl: 27.40.

EXAMPLES 1 and 2

A solution of light-sensitive composition (hereunder referred to as "light-sensitive solution") having the following composition was applied to the surface of a polyethylene terephthalate film of 100μ thick with a spinner and was dried at 100° C. for 2 minutes to form a light-sensitive layer. In this respect, the number of revolution of the spinner was 100 rpm.

| Component | Amount (g) |
|---|---|
| Pentaerythritol tetraacrylate | 1.4 |
| Copolymer of benzyl methacrylate-and-methacrylic acid (molar ratio = 73:27) | 1.3 |
| Light-free radical generator | 0.13 (mM) |
| Methyl ethyl ketone | 12 |
| Propylene glycol monomethyl ether acetate | 12 |

3% By weight aqueous solution of polyvinyl alcohol (degree of saponification=86.5 to 89 mole %; degree of polymerization=1000) was applied onto the light-sensitive layer and was dried at 100° C. for 2 minutes.

Examination of light-sensitivity of the resulting light-sensitive layer was performed as follows:

The light-sensitive layer was exposed to light from a 500 W xenon lamp through a filter (431.5±15 nm; T 45.5%; available from Kenko Co., Ltd.) capable of transmitting light of 430 nm. In the sensitivity measurement, a Fuji PS Step Guide (available from Fuji Photo Film Co., Ltd.; a step tablet whose step number being 15 in all, density difference between the neighbouring two steps being 0.15, and the transmitting optical density of the first step being 0.05) was employed.

The amount of light transmitting through the first step of this step guide was 33.92 mj/cm$^2$ upon 1000 seconds exposure.

Development was performed by immersing the light-sensitive material in a developer having the following composition at 25° C. for one minute.

| Component | Amount (g) |
|---|---|
| Sodium carbonate | 10 |
| Butyl cellosolve | 5 |
| Water | 1 (l) |

Evaluation of the sensitivity can be performed by reading the step number having the maximum optical density among the remaining step images. More specifically, UV absorption spectrum of each step of the resulting step images was determined to obtain a value of optical density (OD) of the step image which showed the maximum absorption among the resultant absorption of the step images, plotting the values of OD against the amount of light irradiated. Thus, sensitivity E (D 10) when the value of OD was reduced to 10% of that observed on un-exposed one and sensitivity E (D 90) when it was reduced to 90% of that observed on un-exposed one could be obtained. The results observed are listed in Table I below.

TABLE I

| Ex. No. | Free Radical Generator | Abs. of Light-S. Material before exposure | | No. of steps | Sensitivity[1] | |
|---|---|---|---|---|---|---|
| | | $\lambda_{max}$ (nm) | OD | | D 10 | D 90 |
| 1 | Comp. (1) | 433 | 0.85 | 10 | 1.13 | 2.78 |
| 2 | Comp. (5) | 432 | 0.81 | 10 | 1.14 | 2.04 |

[1]The sensitivity is expressed in the unit of mj/cm$^2$.

COMPARATIVE EXAMPLES 1 and 2

A comparative light-free radical generator comprised of a simple mixture of compounds (1-S') and (1-A') (0.13 mM each) was used instead of the light-free radical generator compound (1) used in Example 1.

Moreover, a comparative light-free radical generator comprised of a simple combination of compounds (5-S') and (1-A') (0.13 mM each) was used instead of the light-free radical generator compound (5) used in Example 2.

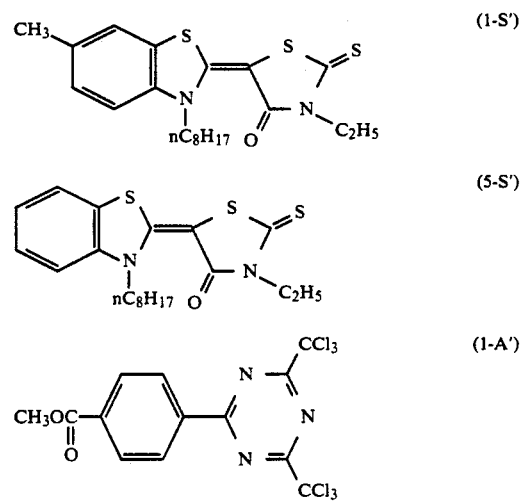

The results thus obtained are summarized in the following Table II.

TABLE II

| Comp. Ex. No. | Free Radical Generator | Abs. of Light-S. Material before exposure | | No. of steps | Sensitivity[1] | |
|---|---|---|---|---|---|---|
| | | $\lambda_{max}$ (nm) | OD | | D 10 | D 90 |
| 1 | (1-S') + (1-A') | 435 | 0.87 | 5 | 6.23 | 8.82 |
| 2 | (5-S') + (1-A') | 432 | 1.00 | 3 | 12.5 | 16.9 |

[1]The sensitivity is expressed in the unit of mj/cm$^2$.

As seen from the results listed in Tables I and II, the light-free radical generators used in the present invention which comprise a light absorbing moiety and an active moiety in a molecule (see Examples 1 and 2) make the sensitivity of the light-sensitive (or photopolymerizable) composition more higher, compared with that observed when a simple combination of a compound having a light absorbing moiety and a compound having an active moiety was used as in Comparative Examples 1 and 2.

EXAMPLE 3

Using free radical generator compound (11), light-sensitive coatings were prepared according to example 1 and 2, and light-sensitivity was testd. In this case the light sensitive layer was exposed through a filter (490 nm±12 nm) capable of transmitting light of 490 nm. Total amount of exposure was 36.2 μW/cm² upon 1000 seconds. As a comparative example, the following compounds were used (0.13 mM was added respectively).

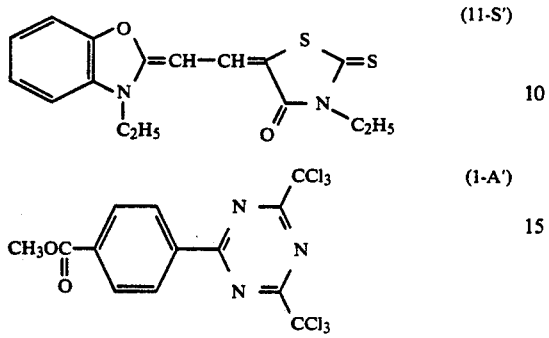

The results observed are listed in Table II below.

TABLE II

| Free radical | Sensitivity (mj/cm²) | |
| Generator | D10 | D90 |
| --- | --- | --- |
| 1. Comp. (11) | 1.16 | 2.14 |
| 2. (11-S') + (1-A') | 9.31 | 12.48 |

EXAMPLE 4

Using free radical generator compound (13), light-sensitive coatings were prepared according to examples 1 and 2, and light sensitivity was tested. In this case the light sensitive layer was exposed through a filter (350 nm) capable of transmitting light of 350 nm. Exposure time was 1000 secounds. As a comparative example the following compounds were used. (0.13 mM was added respectively)

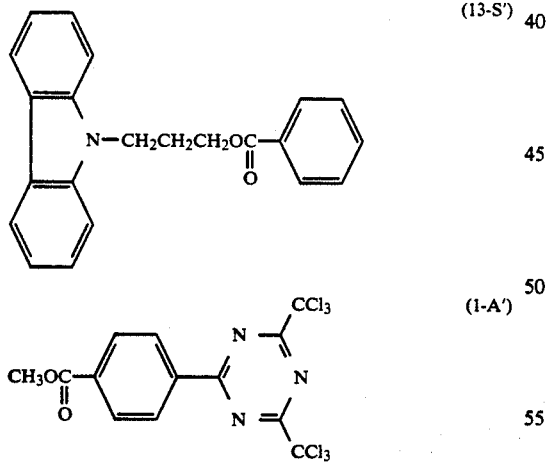

The results observed are listed in Table III.

TABLE III

| Free radical Generator | Sensitivity No of steps |
| --- | --- |
| 1. Comp. (13) | 9 |
| 2. (13-S') + (1-A') | 7 |

What is claimed is:

1. A photopolymerizable composition comprising at least one radical polymerizable compound having an ethylenically unsaturated group and a light-free radical generator, wherein the light-free radical generator is a member selected from the group consisting of the compounds represented by the following formulae (1) to (14):

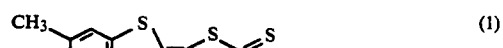
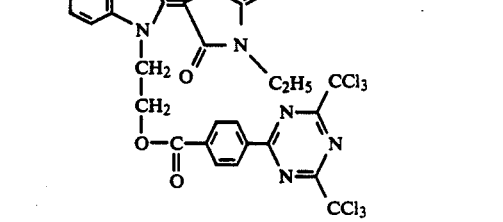
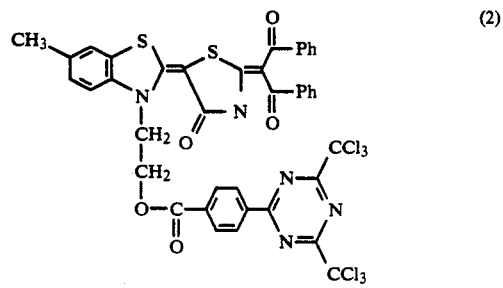
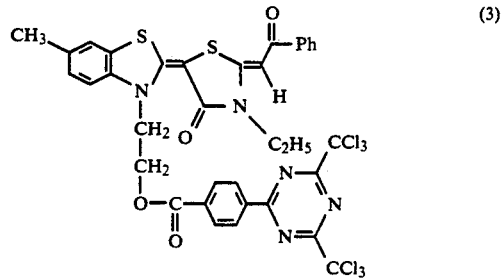
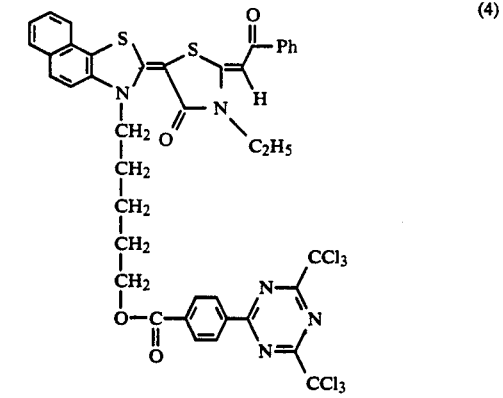
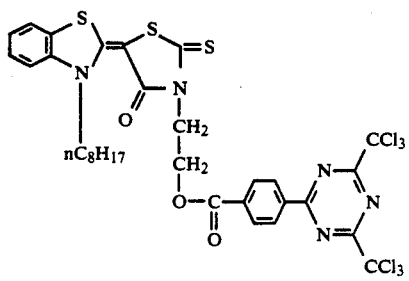

-continued
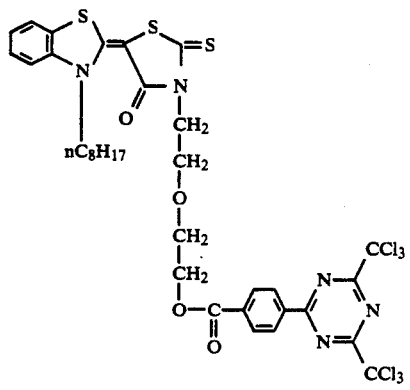
(6)
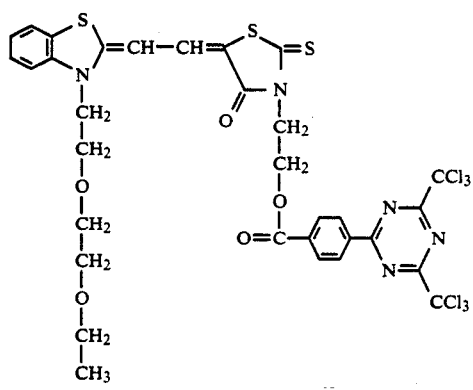
(7)
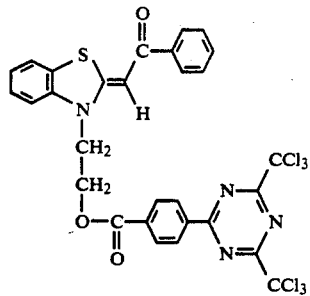
(8)
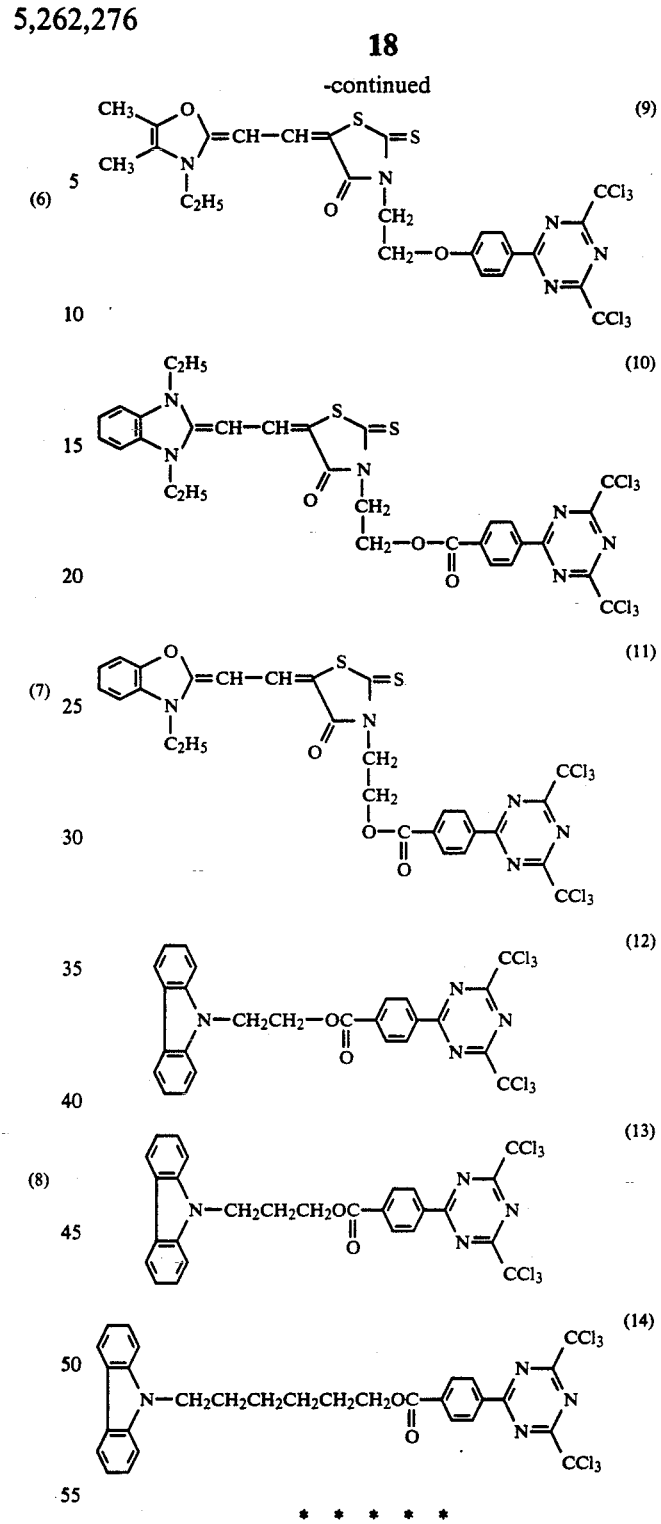
* * * * *